(12) United States Patent
Reznik et al.

(10) Patent No.: US 7,361,936 B2
(45) Date of Patent: Apr. 22, 2008

(54) OPTICAL TRANSMISSION AND/OR RECEIVING DEVICE

(75) Inventors: Daniel Reznik, Berlin (DE); Oliver Stier, Berlin (DE); Melanie Ring, München (DE); Werner Kuhlmann, München (DE); Benjamin Prodinger, Wernberg (AT); Nicola Iwanowski, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 849 days.

(21) Appl. No.: 10/642,543

(22) Filed: Aug. 15, 2003

(65) Prior Publication Data

US 2006/0166387 A1 Jul. 27, 2006

(51) Int. Cl.
*H01L 27/15* (2006.01)
*H01S 3/14* (2006.01)

(52) U.S. Cl. .................. 257/81; 257/82; 257/E33.075; 257/E33.076; 372/36; 372/38.08

(58) Field of Classification Search .................. 257/81, 257/82, 99, E33.056, E33.076, E33.077, 257/E33.075; 372/36, 38.1, 38.02, 38.08

See application file for complete search history.

(56) References Cited

U.S. PATENT DOCUMENTS

| 6,271,049 B1 | 8/2001 | Auracher et al. |
| 6,456,641 B1 * | 9/2002 | Hauer et al. ............... 372/50.1 |
| 6,567,439 B1 * | 5/2003 | Auracher et al. ............. 372/36 |
| 7,061,949 B1 * | 6/2006 | Zhou et al. ................... 372/36 |

FOREIGN PATENT DOCUMENTS

EP 0 660 467 A1 6/1995

* cited by examiner

*Primary Examiner*—Minh-Loan T Tran
(74) *Attorney, Agent, or Firm*—Workman Nydegger

(57) ABSTRACT

An optical transmitting and/or receiving device has a semiconductor component with a first contact for connecting to a reference voltage and a second contact for obtaining or supplying a high-frequency electrical signal. There is also an electrically conducting carrier substrate with a first surface and a second surface. The semiconductor component is configured on the first surface of the carrier substrate. The second surface of the carrier substrate has a metallization that can be connected to a reference voltage applied by an electrical path through the carrier substrate to a first contacting region of the first surface of the carrier substrate. The first contact of the semiconductor component is electrically connected to the first contacting region.

34 Claims, 5 Drawing Sheets

OPTICAL TRANSMISSION AND/OR RECEIVING DEVICE

BACKGROUND OF THE INVENTION

1. Field of the Invention

The invention relates to an optical transmitting and/or receiving device, as used in optical telecommunications engineering. It relates in particular to a construction of an optical transmitting and or receiving device which is distinguished by favorable high-frequency properties. A preferred field of use is that of directly modulated semiconductor lasers in the frequency range greater than 5 GHz and associated receiving devices with a photodiode.

U.S. Pat. No. 6,271,049 B1 and EP 0 660 467 A1 disclose optical components with a laser chip as the light transmitter. The laser chip is arranged on a carrier consisting of silicon, which can be mounted on the base plate of a TO package. The contacting of the laser chip takes place via bonding wires.

The known optical components exhibit good high-frequency properties and data rates of up to about 2.5 Gbits/s. However, at data rates of 10 Gbits/s, rates which have by now been accomplished, the high-frequency (HF) performance deteriorates, since the impedance of the fed-in bonding wires plays an increasingly disadvantageous role with increasing frequency. It has been found that the HF properties of an optical transmitting and/or receiving device are substantially limited by the resultant inductance of the bonding wires, which at frequencies of about 10 Gbit/s is of the order of magnitude of 1 to 1.5 nH (1 nH=1 henry). On account of their inductance, the bonding wires provide a reactance, which is connected in series with the effective resistance of a semiconductor laser of typically 5 ohms, which leads to a change in impedance and an undesired signal reflection.

The problem is intensified by the fact that the appearance of the standard IEEE 802.3ae (10 Gbit Ethernet) and the associated requirements for very compact modules with low power consumption makes it likely that a 50 ohms impedance of the laser module is not viable in the long term for reasons of the power demand, so that it is desirable to change over to a smaller impedance of 20 to 30 ohms. With a smaller impedance of the driver system, however, the sensitivity of the construction to parasitic inductances increases, i.e. the reactance component caused by the inductance of the bonding wires becomes more noticeable and leads to an increased reflection of the high-frequency signal.

There is consequently a need for optical transmitting and receiving devices with which the sensitivity of the construction to parasitic inductances is reduced, to be precise in particular to an extent that the optical transmitting and/or receiving device can be provided with an impedance of 25 ohms.

SUMMARY OF THE INVENTION

The present invention is accordingly based on the object of providing an optical transmitting and or receiving device which is distinguished by low parasitic inductances and in particular can be operated at high data rates in the frequency range of 10 Gbit/s and higher.

The invention provides an optical transmitting and/or receiving device which has: a semiconductor component with a first contact for connection with a reference voltage and a second contact for applying or leading away a high-frequency electrical signal; an electrically conducting carrier substrate with a first surface and a second surface, the semiconductor component being arranged on the first surface of the carrier substrate, the second surface of the carrier substrate having a metallization which is connected to the reference voltage, and the reference voltage being applied by an electrical path through the carrier substrate to a first contacting region of the first surface of the carrier substrate, and the first contact of the semiconductor component being electrically connected to the first contacting region.

The solution according to the invention accordingly envisages forming the carrier substrate of the device from a conductive material and providing the semiconductor component with the reference voltage via an electrical path running through the carrier substrate. For this purpose, the underside of the carrier substrate has a metallization and the surface has a contacting region, and the current path runs between the two surfaces of the carrier substrate.

Using the carrier substrate for contacting the contact of the semiconductor component that is subjected to the reference voltage makes it possible to dispense with a high-frequency pin and consequently to provide a drastic reduction in the overall bonding wire length in the high-frequency path. The parasitic inductances occurring can be considerably reduced as a result, so that there is an improved HF performance into the frequency range greater than 5 GHz, even when the system impedance in the range between 20 and 30 ohms is used.

In a preferred configuration of the invention, the carrier substrate comprises a highly conducting, high-doped semiconductor substrate and an adjoining high-impedance, low-doped epitaxial layer. In this case, the surface of the semiconductor substrate facing away from the epitaxial layer forms the second surface of the carrier substrate, provided with the metallization, and the surface of the epitaxial layer facing away from the semiconductor substrate forms the first surface of the carrier substrate, on which the semiconductor component is arranged. The electrical path through the carrier substrate has an electrically highly conducting connecting region, which extends through the entire epitaxial layer and is connected to the first contacting region.

The reference voltage is consequently raised from the underside of the highly conducting semiconductor substrate initially onto the upper side of the semiconductor substrate, while the epitaxial layer acts together with a constantly provided insulating layer as a dielectric. The electrically highly conducting connecting region then provides an electrical path from the surface of the semiconductor substrate facing the epitaxial layer to the surface of the epitaxial layer or the surface of the carrier substrate, the connecting region extending through the entire epitaxial layer. This connecting region ends at the first contacting region on the surface of the epitaxial layer or of the carrier substrate, so that the reference voltage is raised at this point onto the surface of the carrier substrate.

The connecting region is in this case preferably formed by a local region of the epitaxial layer into which foreign atoms have been diffused (deep diffusion).

A second contacting region on the first surface of the carrier substrate is connected to at least one bonding wire for feeding in or leading away the high-frequency signal. It is noted in this respect that the term "bonding wire" is understood within the scope of the present invention as meaning both a wire bond and a ribbon bond.

This second contacting region is preferably electrically connected via a matching resistor to the second contact of the semiconductor component (on which the high-frequency signal is present). The matching resistor is in this case preferably monolithically integrated into the epitaxial layer of the carrier substrate. This may be realized in various ways, for example by diffusing the resistor into the epitaxial layer or by forming the matching resistor as a polysilicon resistor.

The matching resistor is in this case already integrated into the epitaxial layer during the production process.

In a further preferred configuration, the matching resistor has a negative temperature coefficient. Such a configuration is favorable in particular when the semiconductor component is formed as a semiconductor laser, since a semiconductor laser demands a higher modulation current at increased operating temperatures. This can be achieved, or at least assisted, by a matching resistor with a negative temperature coefficient. A matching resistor with a negative temperature coefficient is provided, for example, by a boron-doped polysilicon resistor.

In a further preferred configuration of the invention it is envisaged to feed a bias current or a bias voltage to the semiconductor component via an inductance. If the semiconductor component is a semiconductor laser, the bias current is the DC biasing current. If the semiconductor component is a semiconductor photodiode, the bias voltage is, in particular, a biasing voltage for setting the operating point of the photodiode.

The connection between the inductance and the second contact of the semiconductor component, which is subjected to the high-frequency signal, lies parallel to a possibly present matching resistor. The bias current or the bias voltage accordingly does not suffer any losses at the matching resistor.

In an advantageous configuration, the first contact of the semiconductor component, on which the reference voltage is present, is connected via a short-circuiting element to the first contacting region of the carrier substrate. The short-circuiting element is in this case only attached during the production of the transmitting and/or receiving device on a wafer after a burn-in. The short-circuiting element is, for example, a piece of solder or a soldered block (jumper). The short-circuiting element has the effect of "activating" a short-circuit with respect to the reference voltage which is present on the first contacting region via the electrically conducting carrier substrate.

The background to this configuration is that the solution according to the invention provides that the contact of the semiconductor component is connected to the reference voltage. However, this is counter to the burn-in concept in panel operation, in which a number of semiconductor lasers of a track are connected in series and are supplied by only one current source. In order nevertheless to implement this concept and consequently to achieve compatibility with existing burn-in processes, a trick is used. One contact of the laser, which is connected to the reference voltage (generally the laser anode) on the finished device, is placed on a floating pad, which is connected to a metallization of the next laser in the burn-in track. The burn-in is then carried out. Before the transmitting device is used in practice, it is then required to connect a contact of the semiconductor component to the reference voltage, which takes place, as explained, by the short-circuiting element with respect to the first contacting region.

In a preferred configuration of the invention, the rear metallization of the carrier substrate is formed as an ohmic contact and arranged on an electrically conducting base plate of a package of the transmitting and/or receiving device, the base plate being connected to the reference voltage. The package is preferably a TO package with a plurality of contact pins, which are led through the base plate of the TO package. TO packages are individual packages for optical components and have forms of construction which are very similar to known forms of construction for transistors (TO=Transistor Outline). The packages comprise a metallic base plate, in which the electrical terminals are provided by glazing. A cap is placed onto the base plate and firmly connected to it. A glass window, for example, is soldered into the cap, in order to achieve an optical passage. TO packages are known per se to a person skilled in the art, so that they are not discussed any further at this point.

The contacting of the TO package with respect to the reference voltage preferably does not take place via one of the contact pins of the TO package, although this is possible in principle, but via a direct soldered connection or adhesively bonded connection to the conducting base plate of the TO package.

The semiconductor component may be both a semiconductor laser and a photodiode. The semiconductor laser and the photodiode are preferably respectively in the form of a prefabricated semiconductor laser chip or photodiode chip with two contacts for the contacting of the chip.

The reference voltage present at the first contact of the semiconductor component is, in particular, the positive operating voltage Vcc, although other reference voltages are also possible.

DESCRIPTION OF THE PREFERRED EMBODIMENTS

FIGS. 1 to 4 show an exemplary embodiment of an optical transmitting device with a semiconductor chip 5, which is arranged on a carrier substrate 1, also referred to as the submount.

Figure 1:
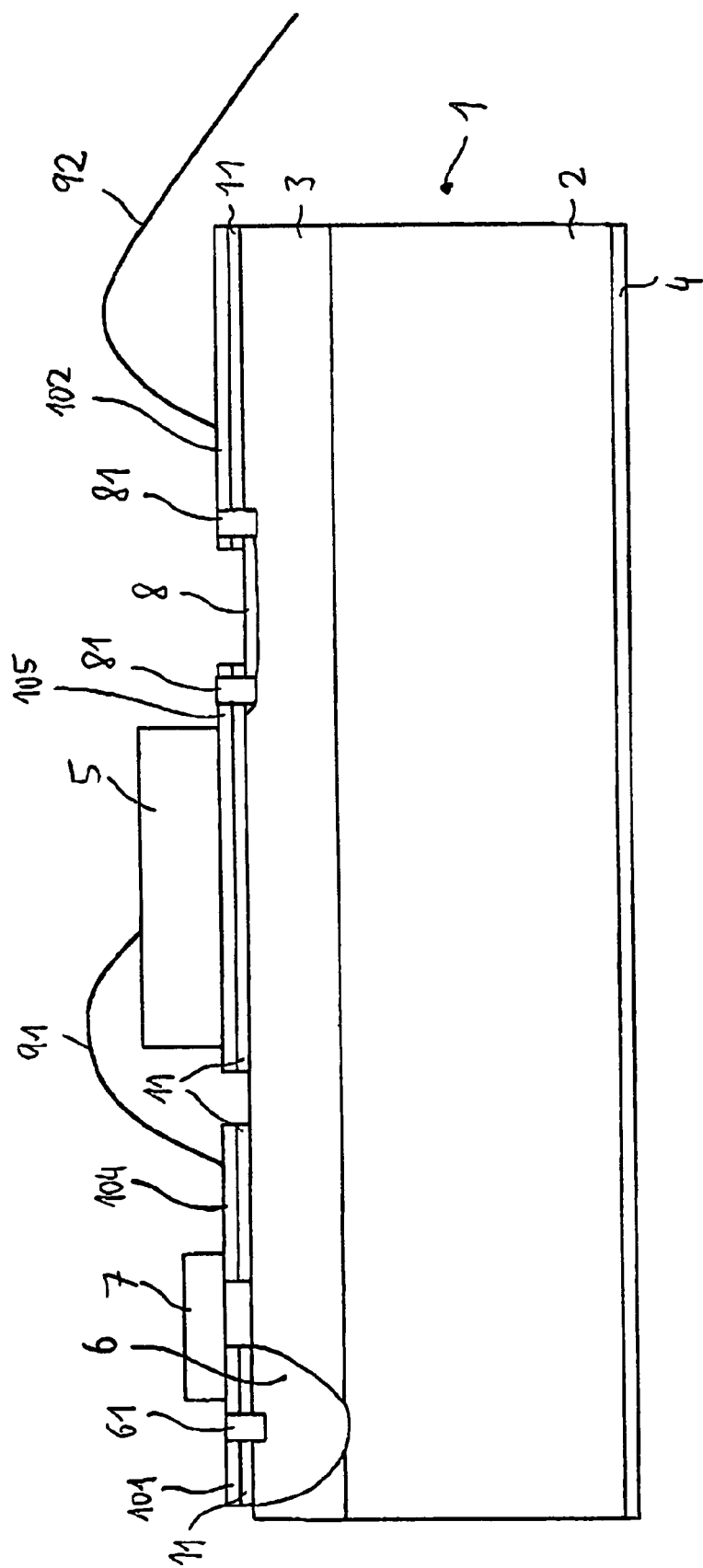
FIG. 1 is a cross sectional view of an optical transmitting device with a carrier substrate providing a current path.

FIG. 1 shows a sectional representation of the submount 1 with the elements arranged on it. The submount-1-comprises a highly conducting silicon substrate 2 and a high-ohmic, low-doped silicon epitaxial layer 3 arranged on it. The silicon substrate 2 preferably has in this case a resistance of between 0.05 and 0.2 ohm-cm, in particular of 0.1 ohm-cm, and a thickness of between 300 and 400 μm, in particular of about 360 μm. The epitaxial layer 3 has a resistance of preferably greater than 20 ohm-cm, in particular of 100 ohm-cm, and a thickness of 30 to 50 μm, in particular of 40 μm.

On the underside of the silicon substrate 2 there is a large-area rear metallization 4, which is, for example, adhesively bonded or soldered onto a TO base plate, as will be explained in more detail on the basis of FIGS. 3 and 4.

Formed in the epitaxial layer 3 is an electrically highly conducting connecting region 6, which is formed by a local region of the epitaxial layer 3 into which foreign atoms have been diffused. Consequently, the connecting region 6 is preferably realized by a deep diffusion from the surface of the epitaxial layer 3, which reaches through the entire epitaxial layer 3. The deep diffusion may take place, for example, by a two-stage phosphorus implantation. Phosphorus is initially implanted into the silicon substrate 1. Subsequently, the epitaxial layer 3 is grown on. Then, phosphorus is again implanted and a diffusion process is subsequently performed at a high temperature of around 1,250° C., so that the diffusion fronts close from above and below.

The silicon substrate 2 and the epitaxial layer 3 themselves are, however, preferably As- or Sb-doped, since these dopants have a much smaller diffusion constant in silicon than, for example, phosphorus. As a result, the effective thickness of the low-doped epitaxial layer 3 in particular can be kept closely under control and the necessary diffusion time can be minimized.

The highly conducting connecting region 6 provides an electrical path between the rear metallization 4 and the surface of the submount 1, whereby a reference voltage present on the underside of the submount 1 is raised onto the surface of the submout 1. This will be explained in still more detail.

The surface of the submount has a multiplicity of contacting regions or metallizations or contact pads 101, 102, 104, 105. Not all the contacting regions can be seen in the sectional representation of FIG. 1. Further metallization regions 103, 106 are represented in the plan view of FIG. 4.

The individual contacting regions 101, 102, 103, 104, 105, 106 are respectively arranged on an insulating oxide layer 11, which preferably has a thickness of 1 μm and is respectively arranged on the surface of the epitaxial layer 3.

A first contacting region 101 is located above the highly conducting connecting region 6 and represents the termination of the latter. For this purpose, a conducting contact hole 61 is provided in the insulating oxide layer 11 in the region of the first contacting region 101, so that the contacting region 101 is electrically connected via the electrical path formed by the contact hole 61, the highly conducting connecting region 6 and the highly conducting silicon substrate 2 to the rear metallization 4, and a voltage present on the rear side metallization 4 is present at the first contacting region 101. A second contacting region 102 is connected to at least one bonding wire 92, via which a high-frequency signal is applied.

The semiconductor laser chip 5, which is for example an edge-emitting 10 Gbit DFB laser with an impedance of 5 ohms, is arranged with its cathode on the underside on a fifth contacting region, which is also referred to below as cathode metallization 105.

The second metallization region 102 is connected to the cathode metallization 105 via a matching resistor 8. In the exemplary embodiment represented, the matching resistor is monolithically integrated into the epitaxial layer 3. For example, the resistor 8 is configured as a diffused resistor. However, other configurations are also conceivable. For example, the resistor 8 may be realized as a polysilicon resistor.

An electrical contact of the matching resistor 8 with respect to the second and fifth contacting regions 102, 105 takes place via contact holes 81. The matching resistor 8 has, for example, an impedance of around 20 ohms. Furthermore, it is pointed out that the matching resistor 8 is located in very close proximity to the laser chip 5, in order to have a favorable HF performance.

The matching resistor 8 preferably has a negative temperature coefficient and for this purpose is configured, for example, as a boron-doped polysilicon resistor. A negative temperature coefficient of the matching resistor 8 is favorable to the extent that the laser chip 5 demands increased modulation current at an increased operating temperature. This can be achieved in a simple way by lowering the matching resistor at high temperatures.

The anode contact, located on the upper side of the laser chip 5, is electrically connected via at least one short bonding wire 91 to a fourth contacting region 104 and from the latter via a short-circuiting element 7 to the first contacting region 101, so that the voltage present at the first contacting region 101 is also present at the anode contact of the laser chip 5.

The short-circuiting element 7 is a piece of solder or a soldered block (jumper), which is attached as a short-circuiting element between the contacting regions 101 and 104 before the transmitting device is used in practice. This configurational variant makes it possible to carry out a burn-in on the wafer before individual separation in panel operation, in which a number of lasers of a track are connected in series and supplied by one current source.

The anode contact of a laser is in this case connected in a conducting manner to the cathode contact of the following laser. In this case, it is disruptive if one contact is electrically connected via the contacting region 101 to the rear metallization 104 of the submount. For this reason, the contacting regions 101, 104 are initially not connected in an electrically conducting manner. Rather, in burn-in operation, the connection takes place via the contacting region 104 to the cathode metallization of the following laser chip. Before use in practice, the short-circuit with respect to the contacting region 101, and consequently with respect to a reference voltage, is then "activated" by fitting the short-circuiting element 7.

Figure 2:
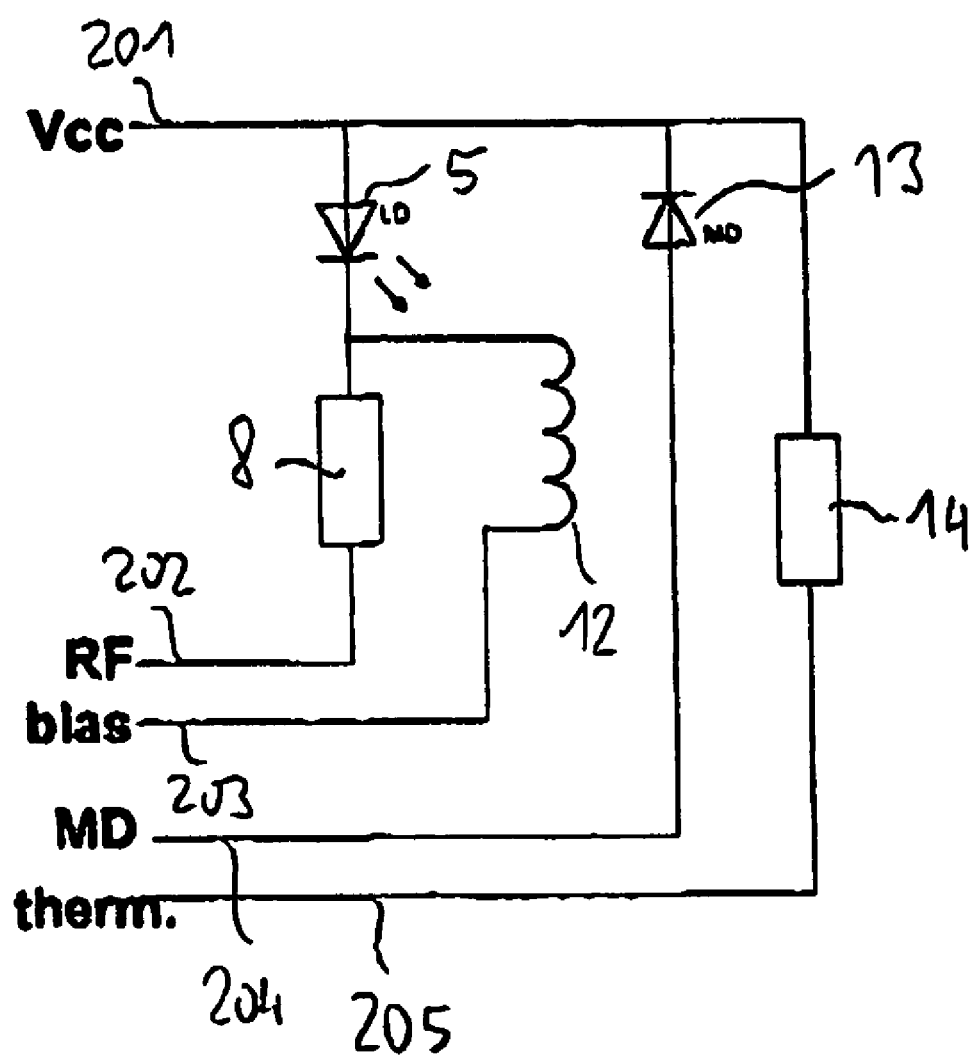
FIG. 2 is an electrical circuit diagram of the device shown in FIG. 1.
Figure 3:
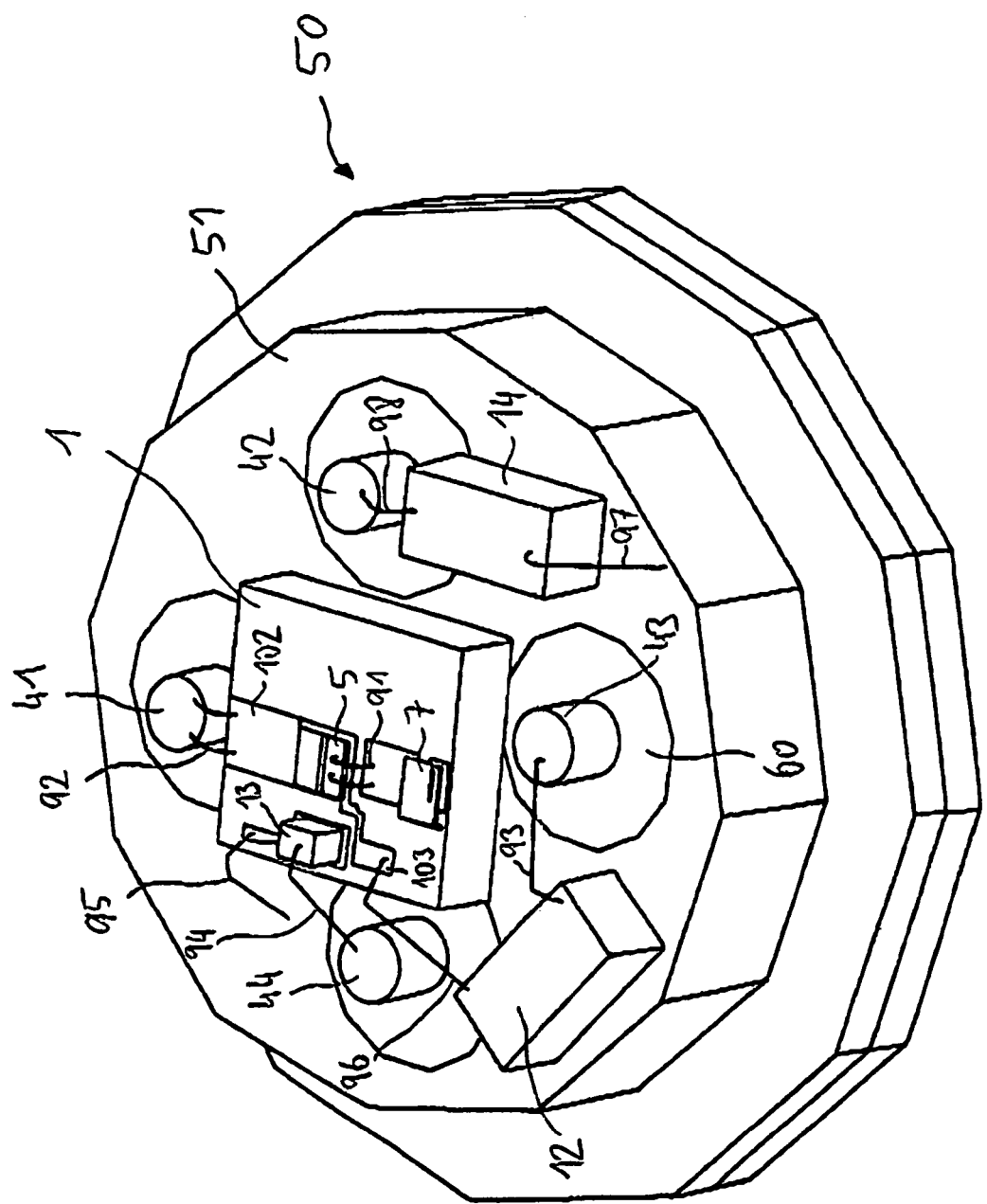
FIG. 3 is a perspective view of the device shown in FIG. 1, in which the carrier substrate is configured on the base plate of a TO package.

Before the mode of operation and the advantages of the arrangement described in FIG. 1 are discussed, first of all the further elements of the transmitting device are also briefly described on the basis of FIGS. 2 and 3.

According to FIG. 3, the submount 1 is located on the electrically conducting base plate 51 of the lower part 50 of a TO package. Four electrical terminal pins 41, 42, 43, 44, which are respectively located in glazed mounts 60, protrude through the base plate 51.

Figure 4:
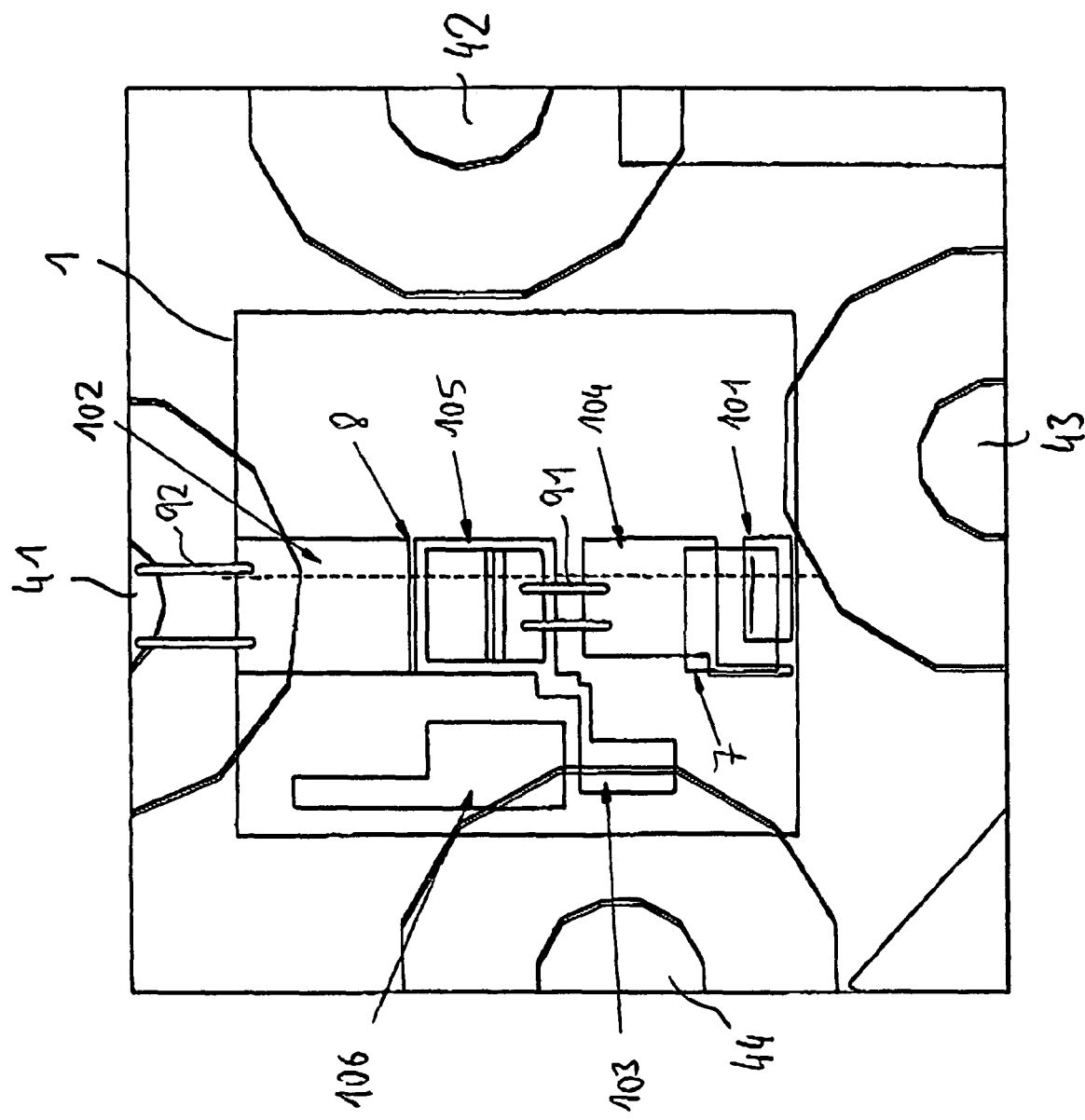
FIG. 4 is a plan view of the configuration shown in FIG. 3 in which the contacting regions of the carrier substrate are shown.

Along with the elements represented in FIG. 1, additionally arranged on the surface of the submount 1 facing away from the base plate 51 is a monitor diode 13, which is located on a sixth contacting region 106 of the submount 1; also compare FIG. 4. Apart from the submount 1, also arranged on the surface of the base plate 51 are a coil 12 and a thermistor 14. The contacting of the elements is in this case as follows.

The electrically conducting base plate 51 is at a reference voltage, which is for example the positive supply voltage Vcc of, for example, 3.3 V. However, if wired differently, there may also be a different reference voltage. In particular, the base plate may in principle also be connected to ground.

The base plate 51 is connected to the reference voltage by contacting on its underside (not represented). In principle, the reference voltage may of course also be provided by one of the pins 41, 42, 43, 44.

The second contact pin 42 is connected via a bonding wire 98 to the thermistor 14. A second contact of the thermistor 14 is connected via a further bonding wire 97 to the base plate and consequently to the supply voltage. The third contact pin 43 is connected via a bonding wire 93 to a first contact of the coil 12, a further contact of the coil 12 being connected via a further bonding wire 96 to the third contacting region 103 of the submount 1.

The fourth contact pin 44 is connected via a bonding wire to the first terminal of the monitor diode 13. The other terminal of the monitor diode 13 is connected via the sixth contacting region 106 and a bonding wire 95 to the electrically conducting base plate 51.

FIG. 2 shows the electrical terminals of the components represented. The pins 41 to 44 provide the terminals 202, 203, 204, 205 for a high-frequency modulation signal RF, a BIAS or a DC biasing current, a signal MD to be taken from the monitor diode and for the signal of the thermistor 14. The positive supply voltage Vcc is applied directly to the electrically conducting base plate 51.

The DC biasing current is in this case fed to the laser diode 5 via the coil 12, which runs parallel to the matching resistor 8. The associated advantages are still to be discussed.

The contacting of the laser chip 5 is now explained. The high-frequency modulation signal is fed to the laser cathode via the pin 41, the bonding wires 92, the second contacting region 102, the matching resistor 8 and the cathode metallization 105. The laser anode on the other hand is connected to the positive supply voltage Vcc. This is made possible by providing an electrical path through the submount 1. The rear metallization 4, the highly conducting silicon substrate 2, the highly conducting connecting region 6, the first contacting region 101, the short-circuiting element 7, the second contacting region 104 and the short bonding wires 91 have the effect that the reference voltage is initially conducted from the underside of the carrier substrate 1 onto the surface of the carrier substrate 1 and, from there, further to the anode contact of the semiconductor chip 5.

The present arrangement consequently provides contacting of the semiconductor chip 5 which manages with only one HF bond 92 to the outside. The laser anode on the other hand is connected via the submount to the positive supply voltage. In this respect it is pointed out that the bonding wires 91 to the anode contact may be made very short. They are much shorter than bonding wires which are led from the submount 1 to the outside to a pin. Also to be regarded as an advantage of the contacting of the laser anode via the submount 1 is that there is greater freedom of design in the positioning of the submount on the base plate. In particular, it is possible to position the submount 1 on the base plate 51 in such a way that the second contacting region 102 lies near the terminal pin 41 (see FIG. 3). This allows the length of the bonding wires 92 to the pin 41 to be reduced.

Consequently, altogether a great reduction in the overall bonding wire length in the high-frequency path between pin 41 and the supply voltage Vcc is provided.

The signals present at the monitor diode 13, the coil 12 and the thermistor 14 are low-frequency, so that the contacting of these elements does not produce any disruptive parasitic inductances.

Of particular advantage is the described configuration that the DC biasing current is fed to the laser cathode via the coil 12, which runs parallel to the matching resistor 8. This prevents the direct-current component that is essential for the function of the laser from causing losses at the matching resistor 8. The coil 12 additionally acts as a high-frequency barrier and to this extent represents a great benefit to the customer, since no sophisticated biasing network has to be constructed and, as a result, space is saved at a critical region of the circuit board design.

In addition, the contacting region 103, from which the coil is contacted, can be used within the aforementioned panel assembly for the convenient testing of the laser chip, without having to go via the matching resistor for this.

In FIG. 4, the individual contacting regions 101-106 and the bonding wires 91, 92 are represented in plan view together with the contact pins 41 to 44. It can be seen, for example, that the contacting region 103 is connected to the cathode metallization 105. It can also be seen well that an electrically conducting connection between the contacting regions 104 and 101 is provided via the short-circuiting element 7.

Figure 5:
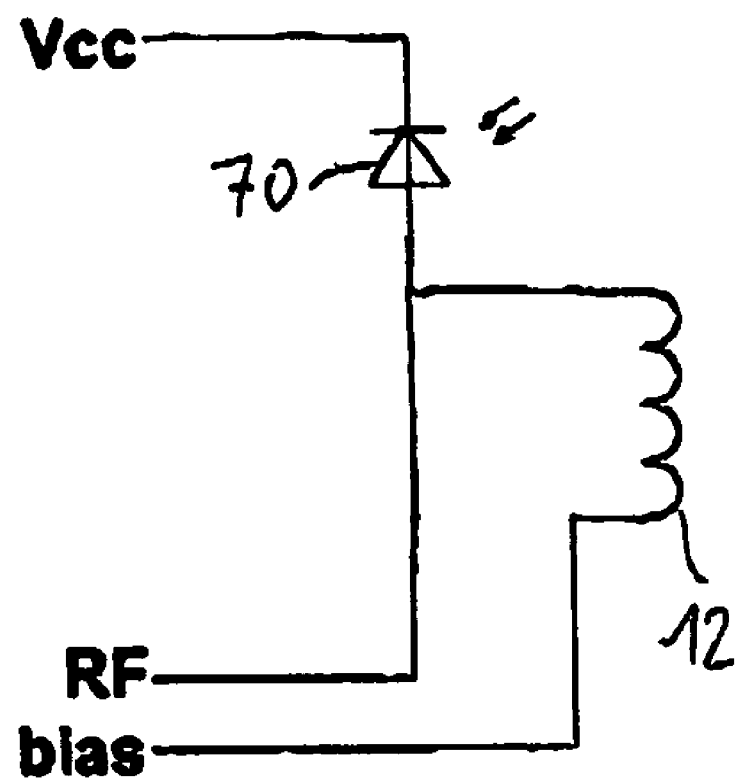
FIG. 5 is an electrical circuit diagram of an optical device corresponding to FIG. 1 in which the semiconductor component is formed as a photodiode.

In another exemplary embodiment it is provided that a photodiode which converts laser light modulated at high frequency into electrical signals is used instead of a laser diode as the semiconductor component of the arrangement. An example of a corresponding circuit with a photodiode 70 is indicated in FIG. 5. In this case, the photodiode cathode is connected via the first contacting region 101 to the operating voltage Vcc. The high-frequency component of the photodiode signal is carried away via the photodiode anode and the bonding wires 92. The biasing voltage, which sets the operating point of the photodiode 70, is provided via the coil 12. It is optionally possible to dispense with a matching resistor, similarly with the use of an additional contacting region 104 with a short-circuiting element 7, in which case the first contacting region would then be connected directly to the cathode terminal of the laser diode. In FIG. 5, only the terminals for the photodiode are indicated. If appropriate, there are further terminals for further components.

It is also pointed out that it may likewise be envisaged to arrange on the carrier substrate 1 both a laser diode and a receiving photodiode, that is to say both components of a transceiver. In this case, both the laser diode and the photodiode are subjected to a reference voltage, as described, via the carrier substrate.

The invention is not restricted in its implementation to the exemplary embodiments presented above, which are to be understood as merely given by way of example. A person skilled in the art appreciates that there are numerous alternative configurational variants which, though deviating from the exemplary embodiments described, make use of the teaching defined in the claims which follow.

We claim:

1. An optical transmitting and/or receiving device, comprising:
   a semiconductor component including a first contact for obtaining a reference voltage and a second contact for obtaining or providing a high-frequency electrical signal;
   an electrically conducting carrier substrate having a first surface and a second surface;
   said semiconductor component configured on said first surface of said carrier substrate;
   said second surface of said carrier substrate having a metallization for obtaining said reference voltage;
   said first surface of said carrier substrate having a first contacting region;
   said carrier substrate having an electrical path for conducting said reference voltage through said carrier substrate to said first contacting region of said first surface of said carrier substrate;
   said first contact of said semiconductor component being electrically connected to said first contacting region of said first surface of said carrier substrate;

wherein said carrier substrate includes a highly conducting, highly-doped semiconductor substrate and an adjoining high-impedance, low-doped epitaxial layer;
said second surface of said carrier substrate facing away from said epitaxial layer;
said epitaxial layer having a surface facing away from said semiconductor substrate;
said surface of said epitaxial layer facing away from said semiconductor substrate forming said first surface of said carrier substrate;
said electrical path through said carrier substrate having an electrically highly conducting connecting region extending through said epitaxial layer; and
said electrically conducting connecting region connected to said first contacting region.

2. The transmitting and/or receiving device according to claim 1, wherein:
said highly conducting connecting region is formed by a local region of said epitaxial layer having foreign atoms diffused therein.

3. The transmitting and/or receiving device according to claim 1, wherein:
said semiconductor substrate has a resistance of between 0.05 ohm-cm and 0.2 ohm-cm.

4. The transmitting and/or receiving device according to claim 1, wherein:
said semiconductor substrate is made of high-doped silicon.

5. The transmitting and/or receiving device according to claim 1, wherein:
said epitaxial layer has a resistance of greater than 20 ohm-cm.

6. The transmitting and/or receiving device according to claim 1, wherein:
said epitaxial layer consists of low-doped silicon.

7. The transmitting and/or receiving device according to claim 1, further comprising:
a bonding wire for obtaining or leading away said high-frequency signal;
said first surface of said carrier substrate having a second contacting region connected to said bonding wire for obtaining or leading away said high-frequency signal.

8. The transmitting and/or receiving device according to claim 7, further compromising:
a matching resistor electrically connecting said second contact of said semiconductor component to said second contacting region;
said semiconductor component being a semiconductor laser.

9. The transmitting and/or receiving device according to claim 8, wherein:
said carrier substrate includes a highly conducting, highly-doped semiconductor substrate and an adjoining high-impedance, low-doped epitaxial layer;
said second surface of said carrier substrate facing away from said epitaxial layer;
said epitaxial layer having a surface facing away from said semiconductor substrate;
said surface of said epitaxial layer facing away from said semiconductor substrate forming said first surface of said carrier substrate;
said electrical path through said carrier substrate having an electrically highly conducting connecting region extending through said epitaxial layer;
said electrically conducting connecting region connected to said first contacting region; and said matching resistor is monolithically integrated into said epitaxial layer.

10. The transmitting and/or receiving device according to claim 9, wherein:
said matching resistor is diffused into said epitaxial layer.

11. The transmitting and/or receiving device according to claim 8, wherein:
said matching resistor is a polysilicon resistor.

12. The transmitting and/or receiving device according to claim 8, wherein:
said matching resistor has a negative temperature coefficient.

13. The transmitting and/or receiving device according to claim 1, further compromising:
a third contacting region configured on said first surface of said carrier substrate;
said third contacting region connected to said second contact of said semiconductor component; and
said third contacting region for feeding a bias current to said semiconductor component.

14. The transmitting and/or receiving device according to claim 13, further compromising:
a bonding wire for obtaining or leading away said high-frequency signal, said first surface of said carrier substrate having a second contacting region connected to said bonding wire for obtaining or leading away said high-frequency signal; and
a matching resistor electrically connecting said second contact of said semiconductor component to said second contacting region; and
a connection between said third contacting region and said second contact of said semiconductor component, said connection running parallel to said matching resistor.

15. The transmitting and/or receiving device according to claim 13, further compromising:
an inductance for feeding said bias current to said third contacting region.

16. The transmitting and/or receiving device according to claim 1, further compromising:
a short-circuiting element connecting said first contact of said semiconductor component to said first contacting region;
said short-circuiting element being attached after a burn-in during production of the transmitting and/or receiving device on a wafer.

17. The transmitting and/or receiving device according to claim 1, wherein:
said carrier substrate has a fourth contacting region connected to said first contact of said semiconductor component or to said second contact of said semiconductor component.

18. The transmitting and/or receiving device according to claim 17, further compromising:
a short-circuiting element connecting said first contact of said semiconductor component to said first contacting region;
said short-circuiting element being attached after a burn-in during production of the transmitting and/or receiving device on a wafer;
said short-circuiting element configured between said fourth contacting region and said first contacting region; and
said short-circuiting element electrically connecting said fourth contacting region and said first contacting region.

19. The transmitting and/or receiving device according to claim 1, further compromising:
a fifth contacting region configured on said first surface of said carrier substrate;
said first contact of said semiconductor component or said second contact of said semiconductor component configured on and electrically connected to said fifth contacting region on said first surface of said carrier substrate.

20. The transmitting and/or receiving device according to claim 19, further compromising:
a bonding wire for obtaining or leading away said high-frequency signal, said first surface of said carrier substrate having a second contacting region connected to said bonding wire for obtaining or leading away said high-frequency signal; and
a matching resistor electrically connecting said second contact of said semiconductor component to said second contacting region;
said matching resistor electrically connecting said second contacting region to said fifth contacting region; and
said semiconductor component being a semiconductor laser.

21. The transmitting andlor receiving device according to claim 19, further compromising:
a third contacting region configured on said first surface of said carrier substrate;
said third contacting region connected to said second contact of said semiconductor component;
said third contacting region for feeding a bias current to said semiconductor component;
said third contacting region connected to said fifth contacting region.

22. The transmitting and/or receiving device according to claim 1, further compromising:
a monitor diode;
said carrier substrate having a sixth contacting region; and
said monitor diode configured on said sixth contacting region of said carrier substrate.

23. The transmitting and/or receiving device according to claim 1, further compromising:
a package having a base plate;
said metallization of said carrier substrate configured on said base plate of said package; and
said base plate connected to said reference voltage.

24. The transmitting and/or receiving device according to claim 23, wherein:
said package is a TO package having a plurality of contact pins led through said base plate.

25. The transmitting and/or receiving device according to claim 24, wherein:
said base plate is made of metal.

26. The transmitting and/or receiving device according to claim 24, wherein:
said plurality of contact pins includes a first contact pin for providing said high-frequency electrical signal and a second contact pin for providing a bias current.

27. The transmitting and/or receiving device according to claim 26, further compromising:
a bonding wire for obtaining or leading away said high-frequency signal, said first surface of said carrier substrate having a second contacting region connected to said bonding wire for obtaining or leading away said high-frequency signal;
said bonding wire connecting said first contact pin to said second contacting region of said carrier substrate.

28. The transmitting and/or receiving device according to claim 26, further compromising:
a third contacting region configured on said first surface of said carrier substrate, said third contacting region connected to said second contact of said semiconductor component, said third contacting region for feeding a bias current to said semiconductor component;
an inductance for feeding said bias current to said third contacting region;
a bonding wire connecting said second contact pin to said inductance; and
a bonding wire connecting said inductance to said third contacting region of said carrier substrate.

29. The transmitting and/or receiving device according to claim 26, further compromising:
a third contacting region configured on said first surface of said carrier substrate, said third contacting region connected to said second contact of said semiconductor component, said third contacting region for feeding a bias current to said semiconductor component; and
an inductance for feeding said bias current to said third contacting region;
said plurality of contact pins including a third contact pin for providing a low-frequency signal terminal.

30. The transmitting and/or receiving device according to claim 29, further compromising:
a monitor diode connected to said third contact pin.

31. The transmitting and/or receiving device according to claim 26, further compromising:
a thermistor mechanically connected to said base plate;
said plurality of contact pins including a fourth contact pin for obtaining a measuring signal from said thermistor.

32. The transmitting and/or receiving device according to claim 1, wherein:
said reference voltage is equal to an operating voltage (Vcc) supplying said semiconductor component.

33. The transmitting and/or receiving device according to claim 1, wherein:
said semiconductor component is a semiconductor laser chip.

34. The transmitting and/or receiving device according to claim 1, wherein:
said semiconductor component is a photodiode chip.

* * * * *